United States Patent
Cornelius (10) Patent No.: US 7,289,383 B2
(45) Date of Patent: Oct. 30, 2007

(54) REDUCING THE NUMBER OF POWER AND GROUND PINS REQUIRED TO DRIVE ADDRESS SIGNALS TO MEMORY MODULES

(75) Inventor: William P. Cornelius, Los Gatos, CA (US)

(73) Assignee: Apple Inc., Cupertino, CA (US)

( * ) Notice: Subject to any disclaimer, the term of this patent is extended or adjusted under 35 U.S.C. 154(b) by 421 days.

(21) Appl. No.: 10/925,174

(22) Filed: Aug. 23, 2004

(65) Prior Publication Data

US 2006/0039205 A1 Feb. 23, 2006

(51) Int. Cl.
*G11C 5/14* (2006.01)

(52) U.S. Cl. .................. 365/226; 365/230.03; 365/191

(58) Field of Classification Search ................ 365/226, 365/230.06, 191
See application file for complete search history.

(56) References Cited

U.S. PATENT DOCUMENTS

| | | | | |
|---|---|---|---|---|
| 5,280,590 | A * | 1/1994 | Pleva et al. | 710/305 |
| 5,956,288 | A * | 9/1999 | Bermingham et al. | 365/230.06 |
| 6,556,506 | B2 * | 4/2003 | Naven | 365/233 |
| 6,697,387 | B1 | 2/2004 | Larson | 370/546 |
| 7,024,518 | B2 * | 4/2006 | Halbert et al. | 711/115 |
| 2006/0041713 | A1 * | 2/2006 | Charles et al. | 711/105 |

* cited by examiner

*Primary Examiner*—Amir Zarabian
*Assistant Examiner*—Kretelia Graham
(74) *Attorney, Agent, or Firm*—Park, Vaughan & Fleming LLP (57) ABSTRACT

One embodiment of the present invention provides a system that reduces the number of power and ground pins required to drive address signals to system memory. During operation, the system receives address signals associated with a memory operation from a memory controller, wherein the address signals are received at a buffer chip, which is external the memory controller. The system also receives chip select signals associated with the memory operation at the buffer chip. Next, the system uses the chip select signals to identify an active subset of memory modules in the system memory, which are active during the memory operation. The system then uses address drivers on the buffer chip to drive the address signals only to the active subset of memory modules, and not to other memory modules in the system memory. In this way, the buffer chip requires fewer power and ground pins for the address drivers because the address signals are only driven to the active subset of memory modules, instead of being driven to all memory modules in the system memory.

30 Claims, 4 Drawing Sheets

REDUCING THE NUMBER OF POWER AND GROUND PINS REQUIRED TO DRIVE ADDRESS SIGNALS TO MEMORY MODULES

RELATED APPLICATION

The subject matter of this application is related to the subject matter in a co-pending non-provisional application by the same inventor as the instant application and filed on the same day as the instant application entitled, "Method and Apparatus for Encoding Memory Control Signals to Reduce Pin Count," having 23 Aug. 2004, and filing date Ser. No. 10/925,173.

BACKGROUND

1. Field of the Invention

The present invention relates to the design of circuitry within computer systems. More specifically, the present invention relates to a method and an apparatus for reducing the number of pins on semiconductor chips, which are required to communicate address and control signals to memory modules within a computer system.

2. Related Art

As processor clock speeds continue to increase at an exponential rate, larger amounts of data are being transferred at correspondingly faster rates between processor and memory. To accomplish this, computer system designers are beginning to user wider data buses to carry more data as well as wider address buses to address larger amounts of memory. These wider buses can greatly increase the number of signal lines between processor and memory.

Furthermore, as more memory modules are incorporated into computer systems to accommodate larger amounts of code and data, additional address signals and memory control signals (such as chip-select (CS) signals, clock-enable (CKE) signals, and on-die termination (ODT) signals) must be added to support the extra memory modules. This further increases the number of signal lines between processor and memory.

Additionally, more drivers are required to drive the address and control signals to the additional memory modules. These additional drivers typically require more power and ground pins on the semiconductor chips that contain the drivers.

In fact, all of the above-described factors increase the required number of pins on processor chips, bridge chips, and associated buffer chips, to communicate signals between processor and memory. Unfortunately, these chips are typically "pad-limited parts," which means that the number of I/O pins determines the die size and also affects the package size. Consequently, adding more pins increases the die size and necessitates using larger and more expensive pin-grid array packages, which can greatly increase cost.

Hence, what is needed is a method and an apparatus for reducing the number of pins, which are required to communicate address and control signals to memory modules within a computer system.

Furthermore, using additional drivers to drive address and control signals to additional memory modules can increase the amount of skew in these address and control signals. This additional skew can increase the amount of time required to synchronize address and control signals at the memory modules, which can greatly increase the time required to perform memory operations.

Hence, what is needed is a method and an apparatus for reducing the amount of time required to synchronize address and control signals received at memory modules.

SUMMARY

One embodiment of the present invention provides a system that reduces the number of power and ground pins required to drive address signals to system memory. During operation, the system receives address signals associated with a memory operation from a memory controller, wherein the address signals are received at a buffer chip, which is external the memory controller. (This buffer chip is used to "fanout" address lines from the north bridge (memory controller) to the system memory, which is an existing technique for saving northbridge pins at the expense of the buffer device; the present application reduces the pin count further in both the north bridge and the buffer itself.) The system also receives chip select signals associated with the memory operation at the buffer chip. Next, the system uses the chip select signals to identify an active subset of memory modules in the system memory, which are active during the memory operation. The system then uses address drivers on the buffer chip to drive the address signals only to the active subset of memory modules, and not to other memory modules in the system memory. In this way, the buffer chip requires fewer power and ground pins for the address drivers because the address signals are only driven to the active subset of memory modules, instead of being driven to all memory modules in the system memory.

In a variation on this embodiment, the buffer chip includes a separate set of address drivers for each memory module in the system memory. In this variation, only one set of address drivers can be active at a given time, thereby reducing the number of power and ground pins required by the address drivers. This also saves system power (about one watt in an exemplary implementation).

In a variation on this embodiment, driving the address signals involves performing timing adjustments on each address signal to compensate for trace-length and/or load variations on corresponding signal lines that carry the address and command/control signals to the memory modules in the system memory.

In a variation on this embodiment, driving the address signals involves using a phase-locked loop (PLL) or a delay-locked loop (DLL) within the buffer chip to synchronize the address signals with memory control signals and clock signals for the system memory. (This synchronization involves maintaining a static phase offset from a reference clock signal on all of the address, control and clock signal outputs of the buffer chip.)

In a variation on this embodiment, the memory control signals can include: chip-select (CS) signals that enable memory chips within the system memory; clock-enable (CKE) signals that enable clock signals for memory chips within the system memory; and on-die-termination (ODT) signals that enable on-die terminators for data signals received at memory chips within the system memory.

In a variation on this embodiment, driving the address signals involves using a phase-locked loop (PLL) to multiply an external clock signal to provide well-controlled phase steps that can be used to perform timing adjustments on the address signals.

In a variation on this embodiment, the system memory can include Unbuffered Dual In-line Memory Modules (UDIMMs), which do not contain an internal fanout register for address signals and memory control signals.

One embodiment of the present invention provides a system that uses encoded memory control signals to reduce pin count on chips that generate and drive memory control signals. During operation, the system receives encoded memory control signals from a memory controller, wherein the memory control signals were encoded to reduce the number of memory control signals, and wherein the encoded memory control signals are received at a buffer chip, which is external to the memory controller. Next, the system decodes the encoded memory control signals on the buffer chip to restore the memory control signals, and then drives the memory control signals from the buffer chip to corresponding memory modules in the system memory. By transferring the memory control signals in encoded form from the memory controller to the buffer chip, fewer pins are required on both the memory controller chip and the buffer chip.

In a variation on this embodiment, the memory control signals can include: chip-select (CS) signals that enable memory chips within the system memory; clock-enable (CKE) signals that enable clock signals for memory chips within the system memory; and on-die-termination (ODT) signals that enable on-die terminators for data signals received at memory chips within the system memory.

In a further variation, the buffer chip does not actually receive ODT signals from the memory controller, but instead synthesizes the ODT signals from corresponding CS signals received from the memory controller.

In a further variation, some of the encoded memory control signals are encoded using a binary encoding scheme that encodes an assertion of one signal line out of N signal lines into a corresponding binary pattern on $\log_2 N$ encoded signal lines.

In a further variation, the binary encoding scheme uses an additional signal line to indicate that none of the N signal lines are asserted.

In a further variation, the CKE signals are encoded using a fanin/fanout encoding/decoding scheme, wherein N CKE signals are divided into N/F groups of F signals, wherein if a signal is asserted within a group of F signals, a corresponding encoded signal associated with the group is asserted. In this variation, decoding the fanin/fanout encoding/decoding scheme involves fanning out each encoded signal to produce F decoded signals, which all have the same value as the encoded signal.

In a further variation, the N CKE signals could be used as a separate bus to set or clear a register in the buffer chip, wherein the register determines the state of a given CKE output line. Such an approach would use the CKE signals as a CKE_Address field and a CKE_H/L indicator line. This would allow the host to set or clear any CKE line at any DIMM, with one line updated for each cycle of the buffer's input clock rate. This would allow for finer granularity of power savings in the system.

In a variation on this embodiment, the memory modules are Dual In-Line Memory Modules (DIMMs), and the memory control signals include separate memory control signals for each rank of each DIMM.

In a variation on this embodiment, driving the memory control signals involves performing timing adjustments on each memory control signal to compensate for trace/load variations on corresponding signal lines that carry the memory control signals to the ranks of memory.

In a variation on this embodiment, driving the memory control signals involves using a phase-locked loop (PLL) or a delay-locked loop (DLL) within the buffer chip to synchronize the memory control signals with address signals and clock signals for the system memory.

In a variation on this embodiment, driving the memory control signals involves using a phase-locked loop (PLL) to multiply an external clock signal to provide well-controlled phase steps that can be used to perform timing adjustments on memory control signals.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Computer System Including Two Buffer Chips

Figure 1:
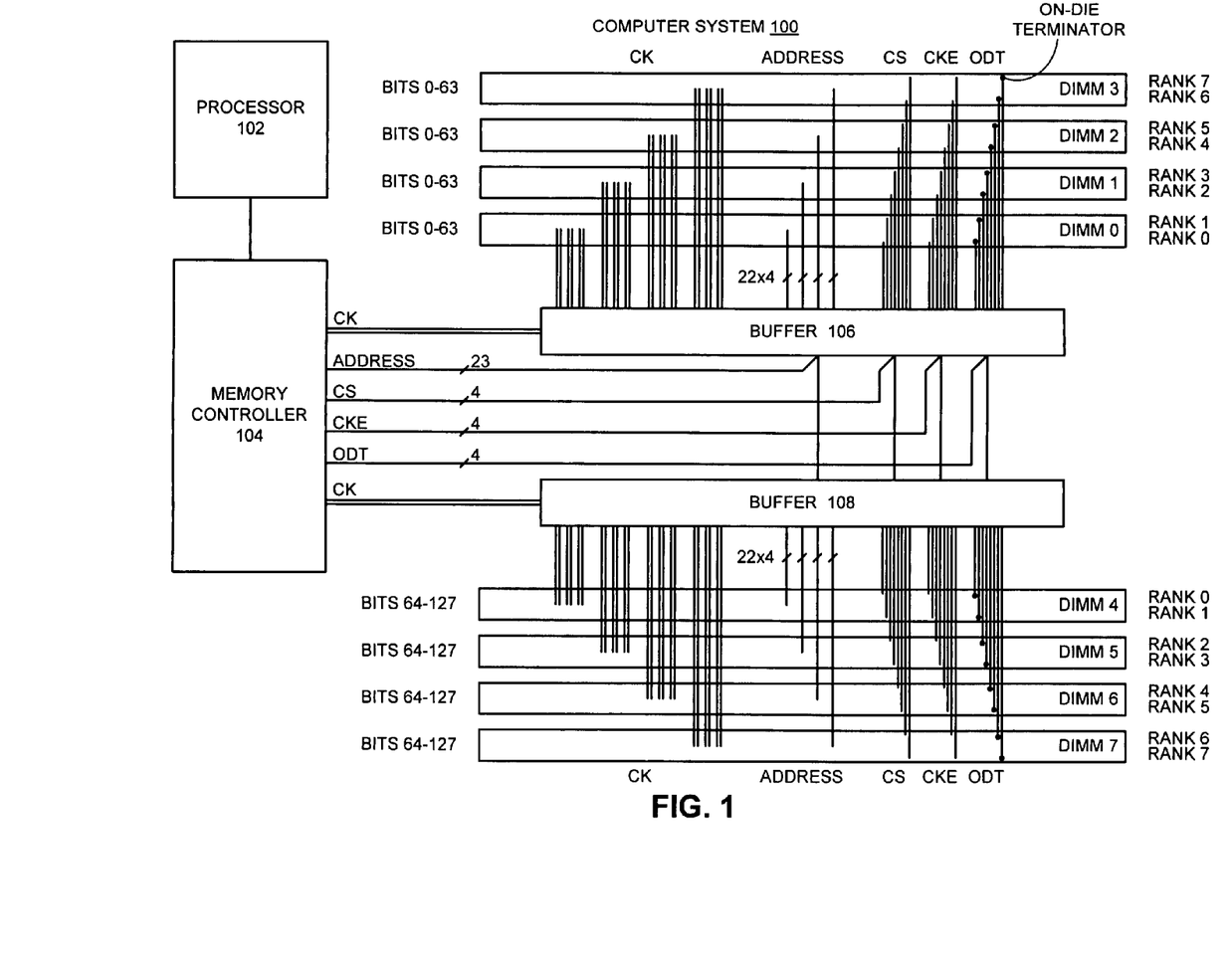
FIG. 1 illustrates a computer system including two buffer chips for address, clock and memory control signals in accordance with an embodiment of the present invention.

FIG. 1 illustrates a computer system 100 including two buffer chips 106 and 108 for address and memory control signals in accordance with an embodiment of the present invention. Computer system 100 can generally include any type of computer system, including, but not limited to, a computer system based on a microprocessor, a mainframe computer, a digital signal processor, a portable computing device, a personal organizer, a device controller, and a computational engine within an appliance.

As is illustrated in FIG. 1, computer system 100 includes processor 102, memory controller 104, buffer chips 106 and 108, and a number of Dual In-line Memory Modules (DIMMs). Note that processor 102 accesses system memory through memory controller 104. In one embodiment of the present invention, memory controller 104 is located within a northbridge chip, which couples together components of computer system 100.

In order to perform memory operations, memory controller 104 feeds a number of signals through buffer chips 106 and 108 to DIMMs 0-7. These signals include address signals and clock signals (CK) as well as memory control signals, including chip-select (CS) signals, clock-enable (CKE) signals, and on-die termination (ODT) signals.

Note that the memory control signals are transferred to buffer chips 106 and 108 in encoded form. These encoded control signals are then decoded within buffer chips 106-108, and the decoded control signals are used to drive DIMMs 0-7. Note that buffer chips 106 and 108 drive the memory control signals separately to each rank of each DIMM.

Furthermore, buffer chips 106 and 108 drive address signals to each DIMM directly. However, note that only address lines for a subset of DIMMs which are active during a current memory operation are driven, and the other address lines are not driven, thereby requiring fewer power and ground pins for buffer chips 106 and 108. For example, a memory transaction to rank 0 of the system memory involves only DIMM0 (for bits 0-63) and DIMM4 (for bits 64-127). Hence, buffer chip 106 only drives address signals to DIMM0 and buffer chip 108 only drives address signals to DIMM4. Consequently, buffer chip 106 and buffer chip 108 only require enough power and ground pins to drive address signals to a single memory module, and these power and ground pins can be shared between sets of drivers for different memory modules.

Buffer chips 106 and 108 also receive a clock signal (CK) and generate three clock signals for each DIMM. Note that these clock signals are in differential form, and are hence transmitted using two wires. Furthermore, the present invention can possibly adjust the duty cycle on CK outputs.

Note that by using drivers in separate buffer chips 106 and 108 to drive address, clock and control signals memory, it becomes possible to use Unbuffered Dual In-line Memory Modules (UDIMMs), which do not contain an internal fanout register for address signals and memory control signals. Without these drivers, it would likely be necessary to use Register DIMMS (RDIMMs), which contain internal fanout registers. Using RDIMMs would introduce extra latency in the address/command/control path, thereby increasing memory path response time and lowering system performance. (Note that one cannot drive eight RDIMMs from the northbridge directly, so such a scheme would require double buffering, which introduces the delay and latency noted above, which is remedied by the present invention).

Also note that timing can be adjusted for separately for each clock signal, address signal and control signal driven from buffer chips 106 and 108 to DIMMs 0-7. Furthermore, a DLL or a PLL can be used to synchronize the clock signals, address signals and control signals with each other. These timing and synchronization mechanisms are described in more detail below with reference to FIG. 3.

Note that the command/control/address lines could be sent using Double Data Rate (DDR) transmission techniques between the memory controller and the buffer to save additional lines on the northbridge and the buffer. Alternatively, different data can be set to the two buffer devices (if the system provides two completely separate memory controllers) without paying for extra pins. In such a scheme, the first beat of address/command/control information would go to one set of DIMMs/buffer, and the second beat of address/command/control information would go to the other set of DIMMs/buffer (see FIG. 1).

Additionally, note the present invention controls the latency of signals from a reference CK signal to CK outputs so that process/voltage/temp variations do not change the latency significantly. This reduces the eye size required at the DIMM, because the eye does not need to be larger to accommodate such variables. This facilitates higher speed operation, or, operation at higher speed without using two cycles instead of one to update address/command/control lines. Furthermore, the latency can be adjusted to align with data-path signals with fine-grain control, since DQS (data strobe) and CK outputs (which are buffered by the buffer) must align at the DIMM in accordance with the DRAM spec ±½ bit time (which is about 950 psec at DDR2 533 Mbps rates).

Computer System Including a Single Buffer Chip

Figure 2:
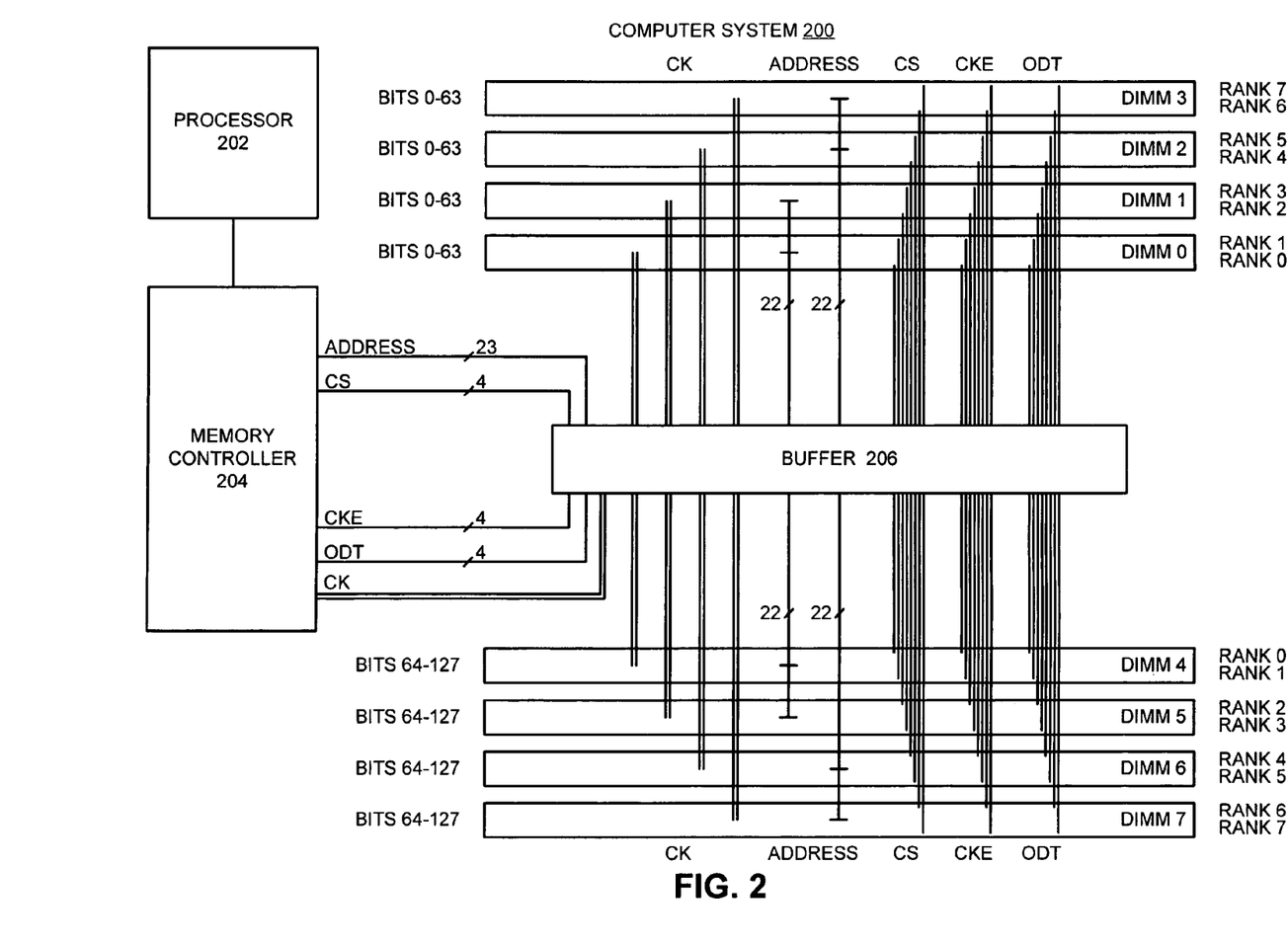
FIG. 2 illustrates a computer system including a single buffer chip for address and memory control signals in accordance with another embodiment of the present invention.

FIG. 2 illustrates a computer system 200 including a single buffer chip 206 to drive address, clock and control signals to memory modules in accordance with another embodiment of the present invention. This single buffer chip 206 is the same as the two buffer chips 106 and 108 illustrated in FIG. 1, except that the clock, address and control signals fan out from the single buffer chip 206 to all of the DIMMs 0-7. Because of this larger fanout, DIMMS 0-7 may need to be RDIMMs, instead of the UDIMMs which can be used with the system illustrated in FIG. 1. RDIMMs can be employed when data rates increase to the point that single clock cycle timing to UDIMMs is no longer achievable.

Buffer Chip

Figure 3:
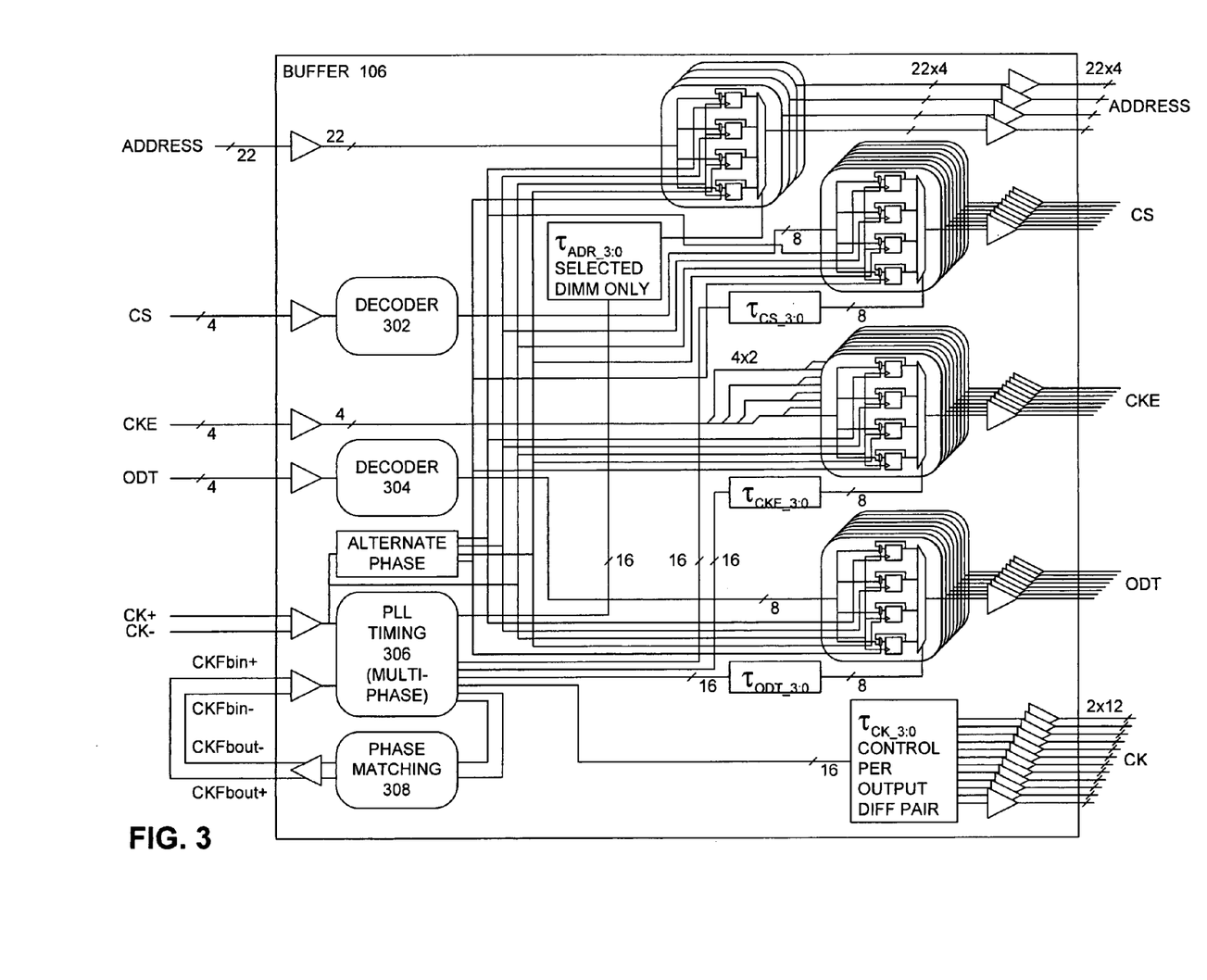
FIG. 3 illustrates a buffer chip in accordance with an embodiment of the present invention.

FIG. 3 illustrates part of the internal structure of a buffer chip 106 in accordance with an embodiment of the present invention. As is illustrated in FIG. 1, buffer chip 106 includes a multi-phase PLL timing circuit 306 and a phase matching circuit 308. These circuits act together to multiply an external clock signal to provide well-controlled phase steps, which can be used to perform timing adjustments on various address signals, control signals and clock signals. Note that these timing adjustments can be based on a predetermined timing adjustment value, $\tau$, which is stored within buffer chip 106 for each individual address line, control line and clock line that is driven to the memory modules by buffer chip 106.

Note that buffer chip 106 receives 22 address line inputs, and uses a separate driver to drive each address line to each memory module. Hence, buffer chip 106 uses 4×22=88 drivers to drive address signals to four memory modules. In doing so, buffer chip 106 uses the chip select signals to enable only address drivers for a subset of DIMMs that are active during a current memory operation, and the other address lines (for inactive memory modules) are not driven. This means that buffer chip 106 only requires power and ground pins for one set of address drivers (for a single DIMM), instead of for all four sets. This potentially saves a large number of pins on buffer chip 106. Note that the circuitry that uses the encoded chip select signals to select a corresponding set of address drivers performs simple decoding operations, which can be performed by circuitry within decoder 302, which is described below.

As is illustrated in FIG. 1, the address signals feed through various multiplexers and flip flops that make timing adjustments for the address signals based upon phase steps produced by PLL timing circuit 306 and a stored $\tau$ value for each address line. These timing adjustments compensate for latency through buffer chip 106 and for skew through signal lines to the memory modules.

Chip select (CS) signals feed through decoder 302, which produces a separate chip select signal for each rank of each DIMM. In one embodiment of the present invention, the system uses a binary encoding scheme, which encodes an assertion of one signal line out of N signal lines into a corresponding binary pattern on $\log_2 N$ encoded signal lines. Furthermore, the binary encoding scheme uses an additional signal line to indicate that none of the N signal lines are asserted. Hence, the system can use three bits for the binary pattern and an additional enable bit (for a total of four bits)

to encode eight chip select lines for buffer chip 106, as well as eight chip select lines for buffer chip 108.

In a similar manner as the address lines, the chip select lines feed through various multiplexers and flip flops that make timing adjustments for the chip-select signals based upon phase steps produced by PLL timing circuit 306 and stored τ values for each chip select line.

The on-die termination (ODT) signals are also decoded in the same way as the chip select signals. More specifically, the ODT signals feed through decoder 304, which produces a separate ODT signal for each rank of each DIMM. These ODT signals also feed through various multiplexers and flip flops that make timing adjustments for the ODT signals based upon phase steps produced by PLL timing circuit 306 and stored τ values for each ODT line.

In another embodiment of the present invention, buffer chip 106 does not actually receive ODT signals from memory controller 104, but instead synthesizes the ODT signals from corresponding CS signals received from memory controller 104. Note that the ODT signals can easily be synthesized from the CS signals because there is a fixed phase relationship between ODT signals and corresponding CS signals, except that ODT signals are not asserted during read operations because the data is being driven onto data pins during read operations, instead of being received on data pins, and hence no on-die termination is needed. (Note that the command signal "WE" is routed through the buffer, so that the buffer will "know" when reads are active.)

In one embodiment of the present invention, the clock enable (CKE) signals are encoded using a "fanin/fanout" encoding/decoding scheme, wherein N CKE signals are divided into N/F groups of F signals. During the encoding process, if a signal is asserted within a group of F signals, a corresponding encoded signal associated with the group is asserted. Conversely, during the decoding process the system fans out each encoded signal to produce F decoded signals, which all have the same value as the encoded signal. Note that both the encoding and decoding mechanisms for the fanin/fanout encoding/decoding scheme are simpler than for a binary encoding scheme. However, a fanin/fanout encoding/decoding scheme causes clock signals to be enabled for more than one rank of memory at a given time. Hence, the circuit operates properly, but consumes slightly more power than a system that enables only a single rank of memory. (Note that the CKE signals can alternatively be encoded using a binary encoding scheme. This, however, requires a register because the active state of CKE can be same or different for many lines, whereas CS or ODT are only active to one device at time.)

The CKE signals also feed through various multiplexers and flip flops that make timing adjustments for the CKE signals based upon phase steps produced by PLL timing circuit 306 and stored τ values for each CKE line.

Finally, a single clock signal (on a differential pair of wires) feeds into PLL timing circuit 306, which produces a phase-aligned output along with various phase steps. These signals are combined with stored τ values for each clock line to produce three phase-aligned clock outputs for each DIMM.

In the present invention, the buffer sources CK signals and address/command/control signals to the DIMMs. By synchronizing these signals using a PLL (which is synchronized to a reference clock signal), variations in CK signals from the output buffer can be tracked by corresponding variations in the address/command/control signals from the output buffer. This synchronization involves maintaining a static phase offset from a reference clock signal on all of the address, control and clock signal outputs of the buffer chip. This synchronization can provide "source synchronous" behavior for the address/command/control versus CK timing to allow higher speed operation.

Selectively Driving Address Signals

Figure 4:
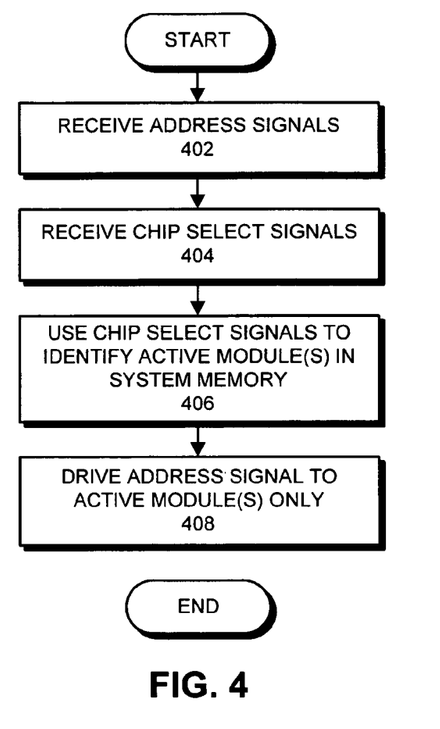
FIG. 4 presents a flow chart illustrating the process of using chip select signals to selectively drive address signals to memory modules in accordance with an embodiment of the present invention.

FIG. 4 presents a flow chart illustrating the process of using chip select signals to selectively drive address signals to memory modules in accordance with an embodiment of the present invention. The system starts by receiving address signals (step 402) and chip select signals (step 404) associated with a current memory operation at a buffer chip. Next, the system uses the chip-select signals to identify memory modules that are active during the current memory operation (step 406). Finally, the system drives address signals to only the active memory modules, and not the other memory modules in system memory (step 408). In this way, the buffer chip requires fewer power and ground pins for the address drivers, because the address signals are only driven to at most an active subset of memory modules, instead of being driven to all memory modules in the system memory.

Decoding Memory Control Signals

Figure 5:
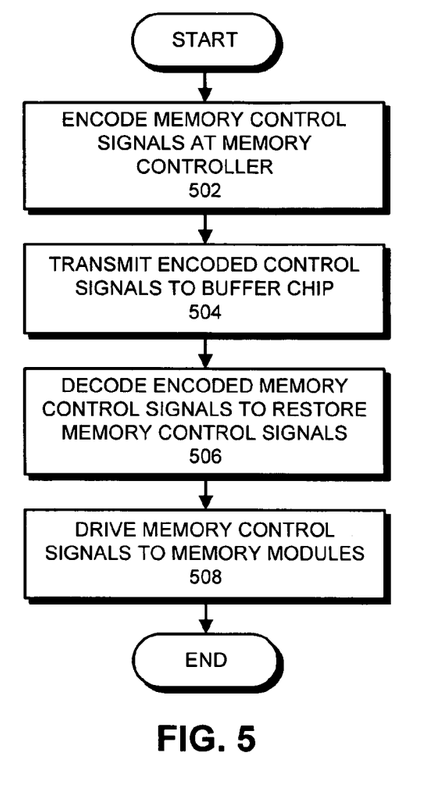
FIG. 5 presents a flow chart illustrating the process of decoding encoded memory control signals in accordance with an embodiment of the present invention.

FIG. 5 presents a flow chart illustrating the process of decoding encoded memory control signals in accordance with an embodiment of the present invention. The system starts by encoding memory control signals at a memory controller (step 502). Note that a number of different encoding schemes can be used, including the binary and fanin/fanout encoding schemes described above. Next, the system transmits the encoded memory control signals to the buffer chip (step 504). Note that by transmitting encoded signals between the memory controller chip and the buffer chip, fewer pins are required on both the memory controller chip and the buffer chip. Next, the encoded memory control signals are decoded to restore the memory control signals (step 506). Finally, the buffer chip drives the decoded memory control signals to the memory modules (step 508).

Other Considerations

The adjustments made possible by the present invention allow programmable corrections to traditional hardware routes, which enables a system to be optimized for specific system configurations. For example, the present invention can compensate for load variations that depend on DIMM type.

Note that single or dual rank DIMMs have different loads and consequently different timing, and we can adjust for these differences without sacrificing address/command/control signaling rates. Hence, there is no eye size impact due to various loads. For a given board design, this makes it possible to load different types of memory, which normally would require larger eye size or slower speeds to assure operation.

Also the present invention can be margin tested with larger programmable ranges by varying the timing over established ranges to assure a given product meets margin goals. This allows the overall system to have less margin, because low-margin systems can be identified and potentially corrected via testing/calibration processes with favorable impact on both yield and performance.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for reducing the number of power and ground pins required to drive address signals to system memory, comprising:
receiving address signals associated with a memory operation from a memory controller, wherein the address signals are received at a buffer chip, which is external the memory controller;
receiving chip select signals associated with the memory operation at the buffer chip;
using the chip select signals to identify an active subset of memory modules in the system memory, which are active during the memory operation; and
using address drivers on the buffer chip to drive the address signals only to the active subset of memory modules, and not to other memory modules in the system memory;
whereby the buffer chip requires fewer power and ground pins for the address drivers because the address signals are only driven to the active subset of memory modules, instead of being driven to all memory modules in the system memory.

2. The method of claim 1,
wherein the buffer chip includes a separate set of address drivers for each of all the memory module in the system memory; and
wherein only one set of address drivers can be active at a given time, thereby reducing the number of power and ground pins required by the address drivers.

3. The method of claim 1, wherein driving the address signals involves performing timing adjustments on each address signal to compensate for trace/load variations on corresponding signal lines that carry the address signals to the active memory modules in the system memory.

4. The method of claim 1, wherein driving the address signals involves using a phase-locked loop (PLL) or a delay-locked loop (DLL) within the buffer chip to synchronize the address signals with memory control signals and clock signals for the system memory.

5. The method of claim 4, wherein synchronizing address signals with memory control signals and clock signals involves maintaining a constant latency across the buffer chip for the address signals, memory control signals and clock signals.

6. The method of claim 4, wherein the memory control signals include one or more of:
chip-select (CS) signals that enable one or more memory chips within the system memory;
clock-enable (CKE) signals that enable clock signals for one or more memory chips within the system memory; and
on-die-termination (ODT) signals that enable on-die terminators for data signals received at one or more memory chips within the system memory.

7. The method of claim 1, wherein driving the address signals involves using a phase-locked loop (PLL) to multiply an external clock signal to provide well-controlled phase steps that can be used to perform timing adjustments on the address signals.

8. The method of claim 7, wherein performing the timing adjustments involves adjusting a latency across the buffer chip for the address signals, one or more memory control signals, and one or more clock signals.

9. The method of claim 1, wherein the system memory include, Unbuffered Dual In-line Memory Modules (UDIMMs), which do not contain an internal fanout register for the address signals and memory control signals.

10. The method of claim 1, further comprising using a DDR technique for address/command/control signals to save additional pins on the buffer chip, or to support two independent memory controllers for two sets of DIMMs with the same pin count on the memory controller chip and the buffer chip.

11. An apparatus that reduces the number of power and ground pins required to drive address signals to system memory, comprising:
a buffer chip;
wherein the buffer chip is configured to receive address signals associated with a memory operation from a memory controller;
wherein the buffer chip is additionally configured to receive chip select signals associated with the memory operation from the memory controller;
an identification circuit within the buffer chip, which is configured to use the chip select signals to identify an active subset of memory modules in the system memory, which are active during the memory operation; and
address drivers within the buffer chip, which are configured to drive the address signals only to the active subset of memory modules, and not to other memory modules in the system memory;
whereby the buffer chip requires fewer power and ground pins for the address drivers because the address signals are only driven to the active subset of memory modules, instead of being driven to all memory modules in the system memory.

12. The apparatus of claim 11,
wherein the buffer chip includes a separate set of address drivers for each memory module in the system memory; and
wherein only one set of address drivers can be active at a given time, thereby reducing the number of power and ground pins required by the address drivers.

13. The apparatus of claim 11, further comprising a timing adjustment mechanism within the buffer chip configured to make timing adjustments on each address signal to compensate for trace/load variations on corresponding signal lines that carry the address signals to the active memory modules in the system memory.

14. The apparatus of claim 11, further comprising a synchronization mechanism within the buffer chip that includes a phase-locked loop (PLL) or a delay-locked loop (DLL), which is used to synchronize the address signals with memory control signals and clock signals for the system memory.

15. The apparatus of claim 14, wherein while synchronizing address signals with memory control signals and clock signals, the synchronization mechanism is configured to maintain a constant latency across the buffer chip for the address signals, memory control signals and clock signals.

16. The apparatus of claim 14, wherein the memory control signals can include:
chip-select (CS) signals that enable one or more memory chips within the system memory;
clock-enable (CKE) signals that enable clock signals for one or more memory chips within the system memory; and on-die-termination (ODT) signals that enable on-die terminators for data signals received at one or more memory chips within the system memory.

17. The apparatus of claim 11, further comprising a phase-locked loop (PLL) within the buffer chip, which is configured to multiply an external clock signal to provide well-controlled phase steps that can be used to perform timing adjustments on the address signals.

18. The apparatus of claim 17, wherein performing the timing adjustments involves adjusting a latency across the buffer chip for the address signals, memory control signals, one or more and one or more clock signals.

19. The apparatus of claim 11, wherein the system memory can include Unbuffered Dual In-line Memory Modules (UDIMMs), which do not contain an internal fanout register for the address signals and memory control signals.

20. The apparatus of claim 11, further comprising a data transfer mechanism that uses a DDR technique for address/command/control signals to save additional pins on the buffer chip, or to support two independent memory controllers for two sets of DIMMs with the same pin count on the memory controller chip and the buffer chip.

21. A computer system which includes circuitry that reduces the number of power and ground pins required to drive address signals to system memory, comprising:
   a processor;
   a system memory;
   a buffer chip;
   wherein the buffer chip is configured to receive address signals associated with a memory operation from a memory controller;
   wherein the buffer chip is additionally configured to receive chip select signals associated with the memory operation from the memory controller;
   an identification circuit within the buffer chip, which is configured to use the chip select signals to identify an active subset of memory modules in the system memory, which are active during the memory operation; and
   address drivers within the buffer chip, which are configured to drive the address signals only to the active subset of memory modules, and not to other memory modules in the system memory;
   whereby the buffer chip requires fewer power and ground pins for the address drivers because the address signals are only driven to the active subset of memory modules, instead of being driven to all memory modules in the system memory.

22. The computer system of claim 21,
   wherein the buffer chip includes a separate set of address drivers for each of all the memory module in the system memory; and
   wherein only one set of address drivers can be active at a given time, thereby reducing the number of power and ground pins required by the address drivers.

23. The computer system of claim 21, further comprising a timing adjustment mechanism within the buffer chip configured to make timing adjustments on each address signal to compensate for trace/load variations on corresponding signal lines that carry the address signals to the memory modules in the system memory.

24. The computer system of claim 21, further comprising a synchronization mechanism within the buffer chip that includes a phase-locked loop (PLL) or a delay-locked loop (DLL), which is used to synchronize the address signals with memory control signals and clock signals for the system memory.

25. The computer system of claim 24, wherein while synchronizing address signals with memory control signals and clock signals, the synchronization mechanism is configured to maintain a constant latency across the buffer chip for the address signals, memory control signals and clock signals.

26. The computer system of claim 24, wherein the memory control signals can include:
   chip-select (CS) signals that enable memory chips within the system memory;
   clock-enable (CKE) signals that enable clock signals for memory chips within the system memory; and
   on-die-termination (ODT) signals that enable on-die terminators for data signals received at memory chips within the system memory.

27. The computer system of claim 21, further comprising a phase-locked loop (PLL) within the buffer chip, which is configured to multiply an external clock signal to provide well-controlled phase steps that can be used to perform timing adjustments on the address signals.

28. The computer system of claim 27, wherein performing the timing adjustments involves adjusting a latency across the buffer chip for the address signals, memory control signals and clock signals.

29. The computer system of claim 21, wherein the system memory can include Unbuffered Dual In-line Memory Modules (UDIMMs), which do not contain an internal fanout register for address signals and memory control signals.

30. The computer system of claim 21, further comprising a data transfer mechanism that uses a DDR technique for address/command/control signals to save additional pins on the buffer chip, or to support two independent memory controllers for two sets of DIMMs with the same pin count on a memory controller chip and the buffer chip.

* * * * *

UNITED STATES PATENT AND TRADEMARK OFFICE
CERTIFICATE OF CORRECTION

PATENT NO. : 7,289,383 B2  
APPLICATION NO. : 10/925174  
DATED : October 30, 2007  
INVENTOR(S) : William P. Cornelius

It is certified that error appears in the above-identified patent and that said Letters Patent is hereby corrected as shown below:

In claim 9 (at column 10, line 2), please delete the word, "include" and replace with the word --includes--.

In claim 18 (at column 11, line 11), please delete the words, "memory control signals, one or more" and replace with the words --one or more memory control signals--.

Signed and Sealed this

Eleventh Day of March, 2008

JON W. DUDAS  
*Director of the United States Patent and Trademark Office*